United States Patent
Feiweier (10) Patent No.: US 7,064,546 B2
(45) Date of Patent: Jun. 20, 2006

(54) METHOD FOR DETERMINING THE $B_1$ FIELD STRENGTH IN MR MEASUREMENTS

(75) Inventor: Thorsten Feiweier, Poxdorf (DE)

(73) Assignee: Siemens Aktiengesellschaft, Munich (DE)

( * ) Notice: Subject to any disclaimer, the term of this patent is extended or adjusted under 35 U.S.C. 154(b) by 5 days.

(21) Appl. No.: 10/726,238

(22) Filed: Dec. 2, 2003

(65) Prior Publication Data

US 2004/0164737 A1 Aug. 26, 2004

(30) Foreign Application Priority Data

Dec. 2, 2002 (DE) .............................. 102 56 210

(51) Int. Cl.
*G01V 3/00* (2006.01)

(52) U.S. Cl. ........................... 324/307; 324/318

(58) Field of Classification Search ........ 324/317–322, 324/306–309
See application file for complete search history.

(56) References Cited

U.S. PATENT DOCUMENTS

| | | | | |
|---|---|---|---|---|
| 3,222,593 A | * | 12/1965 | Denis et al. ............... | 324/301 |
| 4,682,112 A | * | 7/1987 | Beer .......................... | 324/322 |
| 4,707,658 A | * | 11/1987 | Frahm et al. ............... | 324/309 |
| 5,345,175 A | * | 9/1994 | Kasuboski et al. ......... | 324/309 |
| 6,230,039 B1 | * | 5/2001 | Stuber et al. ............... | 600/410 |
| 6,603,989 B1 | * | 8/2003 | Yablonskiy ................. | 600/410 |
| 2003/0078491 A1 | * | 4/2003 | Mueller et al. ............. | 600/410 |
| 2004/0027127 A1 | * | 2/2004 | Mills ......................... | 324/317 |
| 2004/0164737 A1 | * | 8/2004 | Feiweier ..................... | 324/309 |
| 2005/0073304 A1 | * | 4/2005 | Feiweier et al. ............ | 324/307 |

FOREIGN PATENT DOCUMENTS

WO    WO 02/16956 A1 *  2/2002

\* cited by examiner

*Primary Examiner*—Brij Shrivastav
*Assistant Examiner*—Tiffany A. Fetzner
(74) *Attorney, Agent, or Firm*—Schiff Hardin LLP (57) ABSTRACT

In magnetic resonance tomography apparatus and method for determining the field strength of high-frequency pulses which are emitted during a magnetic resonance measurement by the antenna, a magnetic resonance signal excited by a radio-frequency pulse or a radio-frequency pulse sequence is measured, and a phase of the magnetic resonance signal is determined. Based on this phase, the field strength is then determined.

19 Claims, 8 Drawing Sheets

METHOD FOR DETERMINING THE $B_1$ FIELD STRENGTH IN MR MEASUREMENTS

BACKGROUND OF THE INVENTION

1. Field of the Invention

The invention concerns a method for determining the field strength of radio-frequency pulses which are emitted in a magnetic resonance measurement by an antenna of a magnetic resonance measuring device. Moreover, the invention concerns a magnetic resonance measuring device having corresponding arrangement for determining the field strength of emitted radio-frequency pulses

2. Description of the Prior Art

Magnetic resonance tomography (MRT), also known as nuclear spin tomography, has become a widespread technique for obtaining images inside the body of a live examination subject. In order to obtain an image using this technique, the body or the body part being examined of the subject must be exposed to a static basic magnetic field (usually known as the $B_0$ field) which is as homogeneous as possible, the basic magnetic field being generated by a basic field magnet of the magnetic resonance measuring device. While the magnetic resonance images are being recorded, this basic magnetic field has fast-switched gradient fields superimposed on it for spatial encoding, which are generated by gradient coils. Moreover, using radio-frequency antennas, radio-frequency pulses with a defined field strength are radiated into the examination subject. The magnetic flux density of these radio-frequency pulses is normally designated as $B_1$, or rather the pulse-shaped radio-frequency field is generally known as the $B_1$ field for short. Using these radio-frequency pulses, the nuclear spins of the atoms in the examination subject are excited such that they are deflected by a so-called "excitation flip angle" $\alpha$ (hereafter the "flip angle" $\alpha$) from their equilibrium position parallel to the basic magnetic field $B_0$. The nuclear spins then precess around the direction of the basic magnetic field $B_0$. The magnetic resonance signals generated in this manner are recorded by radio-frequency receiving antennas. The receiving antennas can be either the same antennas which were used to emit the radio-frequency pulses or separate receiving antennas. The magnetic resonance images of the examination subject are generated based on the received magnetic resonance signals. Each image point in the magnetic resonance image is assigned to a small body volume known as a "voxel" and each brightness or intensity value of the images points is linked to the signal amplitude of the magnetic resonance signal received from this voxel. The relationship between the resonantly radiated $B_1$ field and the flip angle $\alpha$ thus attained is given by the following equation in the case of a rectangular pulse:

$$\alpha = \gamma \cdot B_1 \cdot \tau \quad (1)$$

where $\gamma$ is the gyromagnetic ratio, which can be considered to be a fixed material constant for most nuclear spin studies, and $\tau$ is the influence duration of the radio-frequency pulse. The flip angle $\alpha$ attained through an emitted radio-frequency pulse and thus the strength of the magnetic resonance signals depends accordingly, besides on the duration of the pulse, also on the strength of the radiated $B_1$ field. Fluctuations in the field strength of the excitation $B_1$ field thus lead to undesired variations in the received magnetic resonance signal which can corrupt the measurement result.

In an unfavorable manner, however, the radio-frequency pulses exhibit particularly in case of high magnetic field strengths—which are necessary due to the required magnetic basic field $B_0$ of currently up to 3 Tesla in an MRT apparatus—an inhomogeneous penetration behavior in conductive and dielectric media such as tissue. The result is that the $B_1$ field can vary widely within the measurement volume. In order to be able to take into account these variations of the $B_1$ field during the measurement, e.g., during an adjustment of the $B_1$ field or during an evaluation of the received magnetic resonance signals, it would be very advantageous if the effect could be determined quantitatively. For this purpose, a number of different techniques already exist which, however, are associated with diverse disadvantages in an unfavorable manner.

In one technique, a series of spin echo images are recorded. Initially a first excitation pulse is emitted which produces a flip angle $\alpha$, and subsequently a further excitation pulse which produces a flip angle $2 \cdot \alpha$. Afterwards, the "echo signal" is measured. A classic example of such a spin echo recording is the emission of a 90° pulse (i.e., $\alpha = 90°$) and a 180° pulse which follows after a certain time span. In order to obtain information about the field strength at the different locations within a measurement volume, a number of series of such spin echo images are measured with different flip angles $\alpha$. Since it is known that the dependency of the amplitude of the magnetic resonance signal on the angle a should be proportional to $\sin^3 \alpha$, by carrying out a corresponding fitting of curves which correspond to the nominal distribution to the measured distribution, the actually attained flip angle $\alpha$ and according to equation (1) also the actual $B_1$ field can be determined for each image pixel. The disadvantage of such measurements is that the technique can be performed only in layers or slices, i.e. only a certain slice thickness of the volume is excited selectively through suitable switching of the gradient fields during the emission of the pulse. This is associated with a very long measurement time of approx. 10 minutes and, due to the layer selection, there is an additional flip angle distribution along the layer normals which results in a corresponding measurement error.

In another technique known hereafter as the "RF field technique", a volume-selective excitation is first performed with a large flip angle $\alpha$. "Large flip angle" is understood to mean flip angles of approximately 720° and greater. Then, a slice-selective spin echo refocusing takes place. In the images measured in this manner, stripe patterns are exhibited, all excitations which attain a certain flip angle $\alpha$ or an arbitrary multiple of this flip angle $\alpha$ exhibiting the same signal intensity. In other words, locations at which a flip angle of $\alpha = 180°$ is attained are displayed identically to locations having a 360° flip angle or 540° flip angle. This technique again has the disadvantage that only individual layers can be investigated and, particularly in case of in vivo measurements, i.e., measurements inside of the subject, only qualitative evaluations are possible.

SUMMARY OF THE INVENTION

An object of the present invention is to provide an alternative to the above described known techniques, which enables a very fast determination of the $B_1$ field strength and in which particularly the intrinsically occurring flip angle distribution in the above described slice techniques along the slice normals has no influence on the measurement results.

This object is achieved according to the invention in a method wherein first a magnetic resonance signal, excited by a radio-frequency pulse or a radio-frequency pulse sequence, is measured and a phase position of the magnetic resonance signal is determined based on this. Based on this phase position, the $B_1$ field strength is then measured. Here, the fact that the local $B_1$ field amplitude can be clearly associated with a phase of the transverse magnetization attained through a suitable excitation pulse is exploited. In other words, in the method according to the invention, the phase information of the MR signal is used to determine the $B_1$ field amplitude and not the amplitude of the transverse magnetization. Since, when using a gradient echo technique, the amplitude of the transverse magnetization is dependent on the spatially different longitudinal relaxation time $T_1$ and transverse relaxation time $T_2$ but the phase information used is not, it is possible in the method according to the invention to make the measurement with a "true" three-dimensional gradient echo technique, e.g., with a spatial resolution which is frequency-encoded in one direction and phase-encoded in two directions. Thus, no slice-selective excitation is necessary, thereby avoiding the measurement error due to the flip angle distribution along the layer normals. Moreover, the measurement time can be kept extraordinarily short through the use of the gradient echo technique. For example, measurement times under a minute can be attained. For the measurements, it is thus particularly preferable to use a gradient echo technique. Basically, however, the measurements alternatively can be made with other techniques.

A magnetic resonance measuring device according to the invention must have in particular a field strength measuring device which allows the emission of the radio-frequency pulse or rather the radio-frequency pulse sequence in order to determine the $B_1$ field strength and subsequently determines the phase position of a measured magnetic resonance signal excited by this and based on this phase position determines the field strength. This field strength measuring device is integrated preferably into the usual controller which is used to control the magnetic resonance measuring device. In particular, it can also be formed to have multiple parts, i.e., consisting of different modules which are integrated into the very different components of the controller. Preferably, the implementation takes place in the form of a software module which can be called up as a $B_1$ measurement program within a computer-supported controller of the magnetic resonance measuring device. By computer-supported controller, a controller is to be understood which is equipped with a suitable processor as well as further components in order to execute the control programs which are provided.

Basically, it is possible to carry out the measurement techniques in an integrative manner, i.e., the $B_1$ field strength is determined within a larger measurement volume not spatially resolved. Naturally, a measurement of this sort can be carried out particularly fast. In a preferred method, however, the magnetic resonance signal is excited in a spatially resolved manner and/or measured within a certain measurement volume and a spatially-dependent phase of the magnetic resonance signal is determined from this. Based on this spatially-dependent phase, finally, the field strength can be determined as a function of the respective location, i.e., basically for each individual voxel within the measurement volume.

The evaluation of the phase takes place preferably so that initially a flip angle attained due to an excitation radio-frequency pulse or rather a radio-frequency pulse sequence is determined and on the basis of the attained flip angle then the field strength is determined according to equation (1).

In a preferred exemplary embodiment, a phase-modulated radio-frequency pulse or rather a phase-modulated radio-frequency pulse sequence is used to excite the magnetic resonance signal. Here, the phase preferably is modulated so that the nuclear spins within a measurement volume are initially rotated for a certain time span around a first axis extending perpendicularly to the basic magnetic field and are subsequently twisted for a further certain time span about a second axis also extending perpendicularly to the direction of the basic magnetic field but obliquely to the first axis. From the phase angle of the transverse magnetization set with such an excitation pulse, the phase angle corresponding to the phase position of the measured magnetic resonance signal, it is possible to directly and unambiguously conclude the flip angle $\alpha$ attained in the tilting about the first axis, the flip angle $\alpha$ in turn being a measure of the $B_1$ field attained at the respective location.

In principle, however, any pulse shape can be used. It is essential only that the excitation pulse leads to a phase position of the magnetic resonance signal which is measurable and dependent on $B_1$ in order to be able to subsequently evaluate this. In particular, a sequence of a number of consecutive pulses having different phases also can be used.

Another alternative is to use a pulse that exhibits, in the time domain, the usual sinc shape, which corresponds in the spatial domain to a rectangular pulse. With a pulse of this sort, a layer can be excited with a relatively exact layer thickness. Since in the measurement, however, preferably a true three-dimensional gradient echo technique is used and thus no selective excitation is required, it is generally not necessary to use a pulse having such a pulse shape.

Thus, a phase-modulated rectangular pulse is preferred, i.e., a pulse which is rectangular within the time domain and starts at a precisely defined time point and ends at a further defined time point. The phase modulation can take place here such that at a precisely determined time point between the start time point and the end time point of the signal a phase jump occurs in order to attain initially the tilting around a first axis described above and subsequently starting at a precisely defined time point—the time point of the phase jump—a tilting around the second axis. Preferably, this phase jump is equal to exactly 90°, which corresponds to the condition which was already formulated above, so the second axis around which the nuclear spin is tilted during the second part of the signal lies perpendicular to the first axis around which the tilting takes place during the first part of the signal.

Since in pure measurement terms the interpretation of an absolute phase position in a real system is problematic due to a number of different influences, preferably a method is used which is based on the evaluation of phase differences. In other words, in order to determine the $B_1$ field strength, magnetic resonance signals excited respectively by radio-frequency pulses or radio-frequency pulse sequences are measured in two separate—preferably directly consecutive—measurements, and in each case the phase positions of the signals are determined. From the phase positions determined during the respective measurements, a phase difference is then determined based on which the field strength is determined. It is also possible to make more than two measurements and to determine in each case the phase differences between the measurements, but generally two measurements suffice.

Preferably, the measurements do not differ except for the use of different radio-frequency pulses or rather radio-frequency pulse sequences, i.e., an identical measurement technique is used.

In a preferred exemplary embodiment, a radio-frequency pulse or a radio-frequency pulse sequence is used to excite the magnetic resonance signal in one of the measurements that starts with a certain phase, and the phase being is after a certain time span by a certain value in a first direction. In the other of the measurements, a radio-frequency pulse or a radio-frequency pulse sequence is then used which starts with the same phase as the radio-frequency pulse or radio-frequency pulse sequence used in the first measurement, the phase then being shifted after the same time span by the same value but in the opposite direction. In other words, during the first measurement initially a certain phase is used for measuring, and starting at a certain time point a phase jump of 90° occurs, and during the second measurement initially the same phase is used for measuring, and at the same time point a phase jump of −90° then occurs. Up to the point in time of the phase jump, the evolution of the magnetization proceeds in both measurements identically. In each case initially the nuclear spins within the measurement volume are rotated for a certain time span around a first axis. Starting at the point in time of the phase jump, in the first measurement the nuclear spins are twisted around the second axis in a first direction and in the second measurement around the same axis but in the opposite direction.

Since the excited magnetic resonance signal is also a function of the basic magnetic field $B_0$, the results achieved with this measurement technique become better as the $B_1$ field radiated for measurement purposes becomes larger with respect to possible inhomogeneities of the basic magnetic field $B_0$. Thus, a short intensive radio-frequency pulse or a sequence of short intensive radio-frequency pulses preferably is used to excite the magnetic resonance signal. The terms "short" and "intensive" as used herein mean that a $B_1$ field is attained which is as large as possible with respect to the deviations of the basic magnetic field $B_0$.

Insofar as the inhomogeneities of the basic magnetic field are known as a function of the location, e.g., values determined through prior measurements, simulations or computations are available, they can also be taken into account in the spatially-dependent determination of the $B_1$ field strength according to the invention.

Since spatially-dependent distributions of the emitted $B_1$ field also can be measured in vivo extraordinarily fast using the method according to the invention, an in vivo adjustment of the $B_1$ field strength of radio-frequency pulses is also enabled during the measurement in this manner. Here, preferably the field strength in a certain volume region of particular interest in an examination subject is optimized.

An adjustment technique of this sort during the examination to optimize the $B_1$ field strength in a certain volume region of the examination subject is, moreover, basically useful and can be performed, insofar as the data about the $B_1$ field strength distribution within the examination subject can be determined with other techniques, also independently of the measurement technique according to the invention.

DETAILED DESCRIPTION OF THE PREFERRED EMBODIMENTS

In order to provide a detailed explanation of the method, it will first be shown how, using simple radio-frequency excitation pulses, a clear relationship is possible between a phase angle of the attained transverse magnetization which can be detected as the phase position of the magnetic resonance signal and the $B_1$ field amplitude. In the present exemplary embodiment, for simplicity—but without restricting the inventive concept—a radio-frequency pulse $HF_1$, $HF_2$ with duration t will be assumed with a rectangular amplitude curve according to FIG. 1. This radio-frequency pulse $HF_1$, $HF_2$ is present from a starting time point 0 up to the time point t/(1+f) with a phase of 0° and afterwards with a phase of 90° (the indications refer to a rotating coordinate system or rather the interaction image). The factor f is a constant factor.

Figure 1:
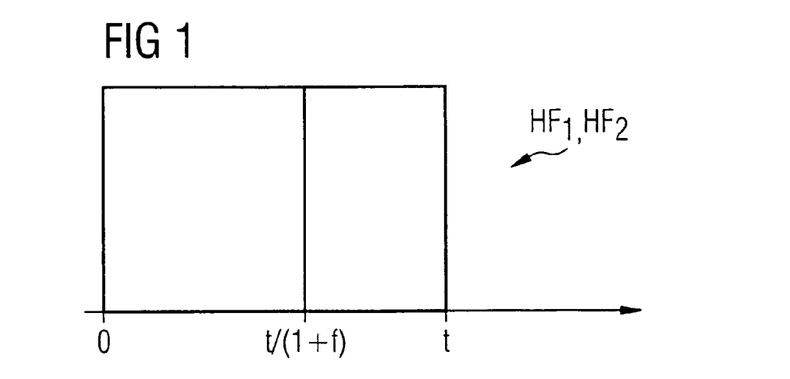
FIG. 1 is a basic representation of a phase-modulated rectangular pulse for exciting the magnetic resonance signal for a measurement according to the invention.
Figure 2:
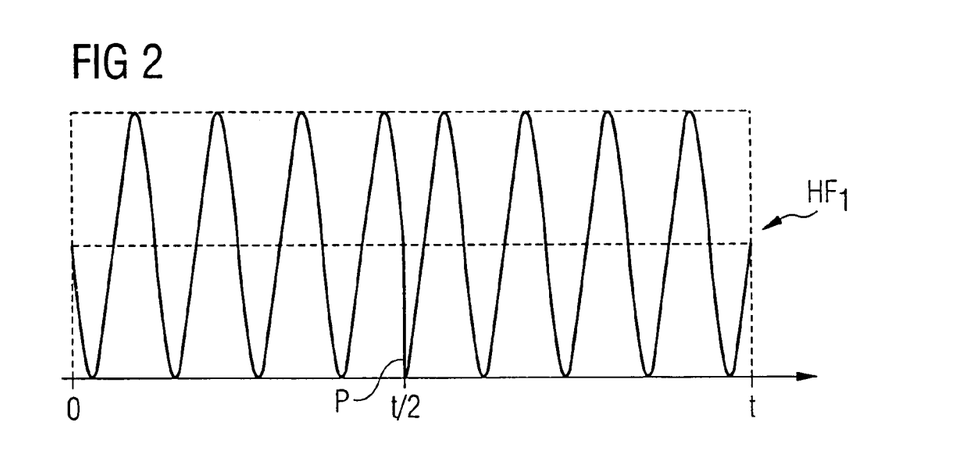
FIG. 2 is a schematic representation of a first exemplary embodiment of the rectangular pulse according to FIG. 1.

FIG. 2 shows a special exemplary embodiment for the case in which f=1. The envelope pulse shape of the radio-frequency pulse $HF_1$ corresponds here to the rectangular shape according to FIG. 1. The carrier frequency of the radio-frequency pulse $HF_1$ corresponds to the magnetic resonance. The signal starts at time point 0 with the phase 0 and at time point t/2 there occurs a phase jump P of 90° so that the signal in the second time period [t/2, t] is phase-shifted by 90° with respect to the signal in the first time period [0, t/2].

Figure 4A:
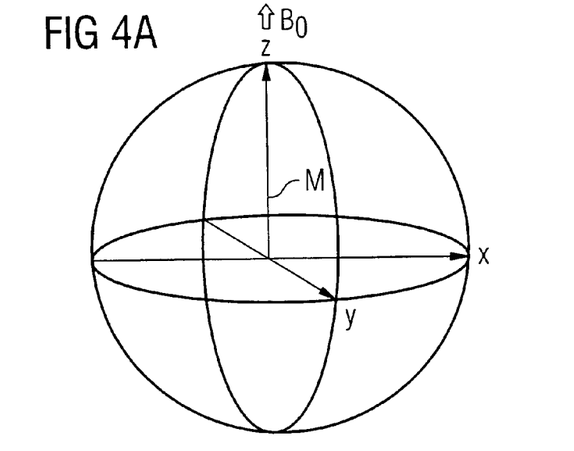
FIGS. 4A–4C schematically illustrate the orientation of a magnetization vector in the basic magnetic field through influence of a radio-frequency pulse according to FIG. 2.
Figure 4B:
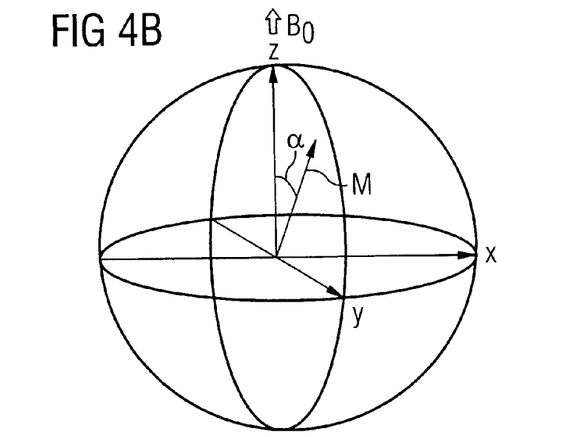
Figure 4C:
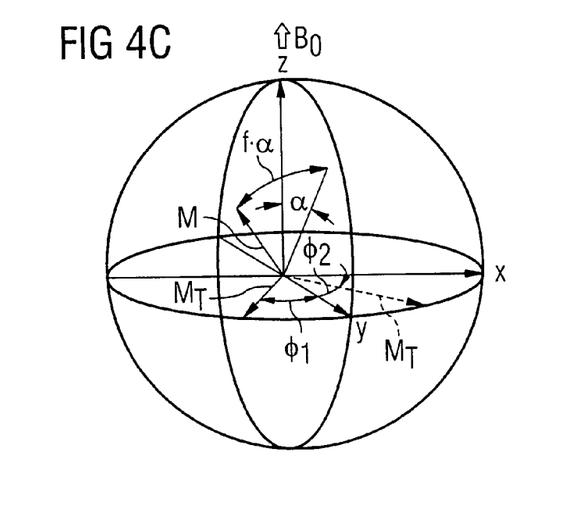

FIGS. 4A to 4C illustrate the effect which such a radio-frequency pulse according to FIG. 1 or rather FIG. 2 has on the nuclear spins in the affected measurement volume or rather on the magnetization vector M.

If it is assumed that a basic magnetic field $B_0$ is present in the z direction, then the magnetization vector M lies without influence of the outer radio-frequency pulse parallel to the basic magnetic field $B_0$. It thus has the coordinates $M=(x,y,z)=(0,0,1)$. Through the first part of the radio-frequency pulse $HF_1$ present with a field strength $B_1$ in the time period $[0, t/2]$, the magnetization vector M is initially rotated by the flip angle $\alpha$ according to the equation (1) referenced above around the x axis.

Starting from this position, the magnetization vector M is then tilted by the second part of the pulse which is still present with the field strength $B_1$—but with the phase shifted—in the time period $[t2, t]$ by an angle $f \cdot \alpha = \alpha$ (for $f=1$) around the y axis (FIG. 4c). For the transverse component of the magnetization vector lying in the x/y plane, i.e., for the coordinates of the transverse magnetization vector $M_T$ which is measurable in the form of the magnetic resonance signal, there results the coordinates $M_T=(x,y)=(\cos(\alpha) \cdot \sin(f \cdot \alpha), -\sin(\alpha))$. The angle $\phi_1$ enclosed with the y axis of this transverse magnetization vector $M_T$ corresponds to the phase position of the vector $M_T$. It also indicates the phase position of the measurable magnetic resonance signal. According to the rule $\tan \phi_1 = y/x$, there follows:

$$\Phi_1 = \operatorname{atan}\left(\frac{-\sin\alpha}{\cos(\alpha) \cdot \sin(f \cdot \alpha)}\right) \quad (2)$$

Figure 5:
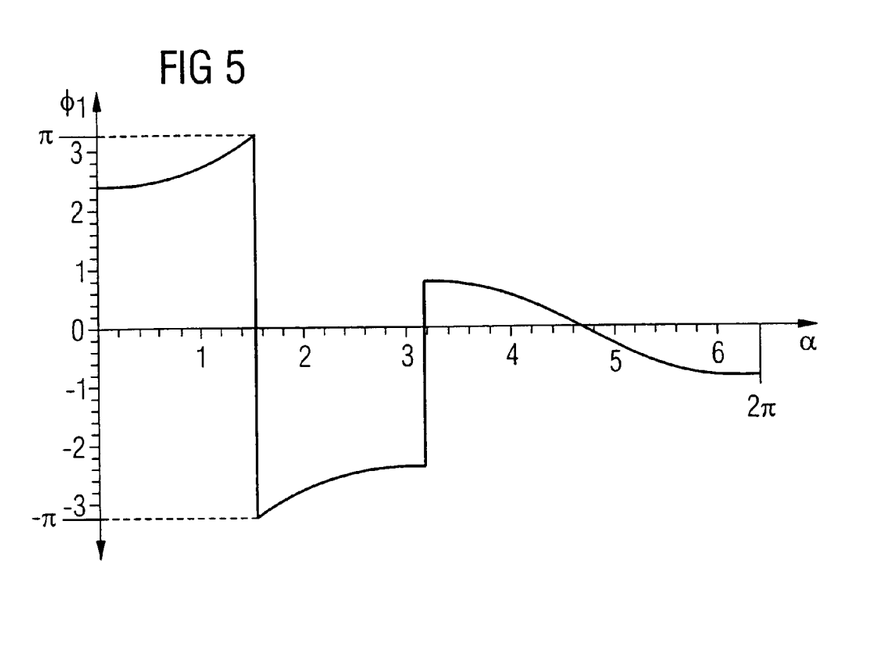
FIG. 5 is a graph illustrating the dependency of the phase angle φ of the transverse magnetization of the magnetization vector according to FIG. 4C as a function of the attained flip angle α of the magnetization vector according to FIG. 4B.

FIG. 5 illustrates the dependency of the angle $\phi_1$ on $\alpha$ for the case in which $f=1$. This graphic shows that a clear relationship between the angle $\phi_1$ in the interval $[\pi, -\pi]$ is possible with the angle $\alpha$ in the interval $[0, 2\pi]$. In other words, the attained excitation flip angle $\alpha$ and thus according to equation (1) the $B_1$ field actually present at the respective location can be determined as a basic rule from the phase position determined from the measured magnetic resonance signal.

However, since the interpretation of the absolute phase position is difficult in a real system, preferably the method is extended such that an evaluation can occur based on phase differences.

Figure 3:
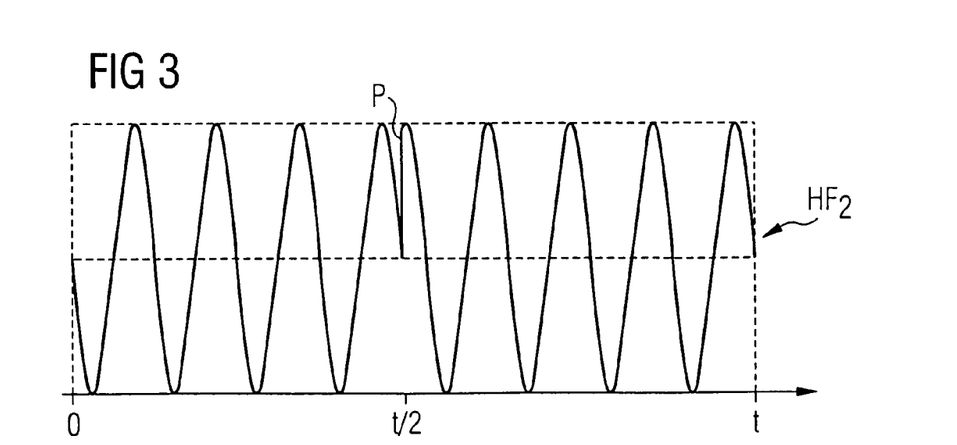
FIG. 3 is a schematic representation of a second exemplary embodiment of the rectangular pulse according to FIG. 1.

For this purpose, after emission of a first radio-frequency pulse $HF_1$ according to FIG. 2 and measurement of the magnetic resonance signal excited thereby, again an additional radio-frequency pulse $HF_2$ according to FIG. 3 is emitted. It starts with the same phase as the first radio-frequency pulse $HF_1$. Likewise also with the second radio-frequency pulse $HF_2$, the phase is shifted after the same time span by the same value as for the first radio-frequency pulse $HF_1$ but this time in the opposite direction.

Upon radiation of this radio-frequency pulse $HF_2$, the tilting of the magnetization vector M takes place according to FIGS. 4A to 4C around the x axis still identically as for the first radio-frequency pulse $HF_1$. Not until the phase jump does the picture change in that the magnetization vector M is not tilted as in FIG. 4C in the counterclockwise direction but instead is tilted in the clockwise direction about the y axis by the angle $f \cdot \alpha = \alpha$. In other words, up to the time point $t/(1+f)=t/2$, the evolution of the magnetization proceeds identically in both measurements. Only the subsequent rotation about the y axis takes place with different signs. The position of the transverse component of the magnetization vector $M_T$ is shown in FIG. 4C with a dashed line. It can be seen that here a phase shift by the angle $\phi_2$ has taken place, where $\phi_1=-\phi_2$.

Figure 6:
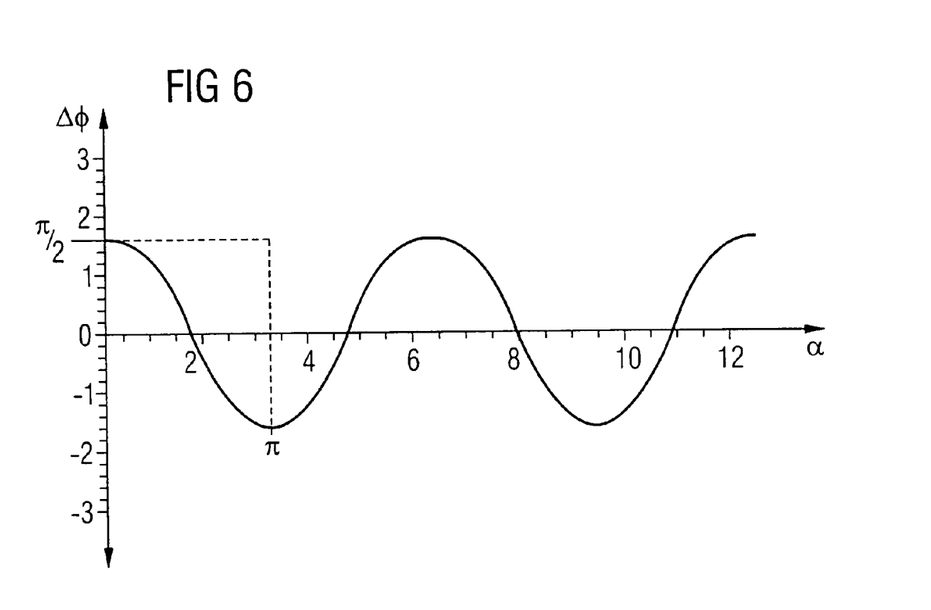
FIG. 6 is a graph illustrating the dependency of the differential phase angle Δφ on the attained flip angle α.

In FIG. 6 for the assumed case in which $f=1$ for the radio-frequency pulses $HF_1$, $HF_2$ according to FIGS. 2 and 3, the phase difference $\Delta\phi = \phi_1 - \phi_2$ of the transverse magnetization $M_T$ of the two magnetic resonance signals measured after excitation with the radio-frequency pulses $HF_1$, $HF_2$ is plotted as a function of $\alpha$. This graphic shows that at least in the interval $\alpha=[0, \pi]$, there is a clear relationship between the phase difference $\Delta\phi$ and the excitation flip angle $\alpha$ so that accordingly an unambiguous conclusion can be made about the excitation flip angle $\alpha$ also from a measured phase difference $\Delta\phi$.

For the special case in which $f=1$, the following analytical relationship ensues from equation (2):

$$\cos(\Delta\Phi) = \frac{\sin^2\alpha}{1+\cos^2\alpha} \quad (3)$$

$$\sin^2\alpha = \frac{2 \cdot \cos(\Delta\Phi)}{1+\cos(\Delta\Phi)} \quad (4)$$

For other values of f, equation (2) can be solved numerically and a correspondingly similar relationship derived so that for these cases too an unambiguous relationship can be produced as a basic rule between a measured phase difference $\Delta\phi$ and an attained flip angle $\alpha$.

FIG. 6 shows that for a very small flip angle $\alpha$ due to the small slope of the curve, an evaluation is difficult in this region. For an excitation flip angle $\alpha$ of over approx. 10°, however, an evaluation can be performed with no problems. Accordingly, the excitation radio-frequency signal should be chosen to be sufficiently strong in order to achieve corresponding excitation flip angles of over 15°.

The measurement technique according to the invention for three-dimensional measurement of the $B_1$ field proceeds as follows based on the above described principles:

First, a first gradient echo measurement which is phase-encoded in two dimensions and frequency-encoded in one dimension is performed, a radio-frequency pulse $HF_1$ according to FIG. 2 being chosen as the excitation pulse. As the measurement result, a three-dimensional matrix is obtained with complex measured values. Using a three-dimensional Fourier transformation, from this 3-D matrix a further 3-D matrix is obtained whose matrix elements contain for each individual voxel within the measurement volume the amplitude and the phase $\phi_1$ of the transverse magnetization $M_T$.

Subsequently, in the same manner a second 3-D gradient echo measurement is performed, only a radio-frequency pulse $HF_2$ according to FIG. 3 being used. Based on the 3-D matrix obtained from this measurement, again through a Fourier transformation a further 3-D matrix is obtained whose matrix elements correspond in each case to the measured phase position $\phi_2$. By forming the difference between the two three-dimensional matrices, a further 3-D matrix is obtained whose matrix elements correspond to the phase difference $\Delta\phi$ for the individual voxels. Using equation (3), for each voxel from the phase difference $\Delta\phi$ the flip angle $\alpha$ attained there can be determined, i.e., a new 3-D matrix is produced in which exactly the attained flip angle $\alpha$ for the individual voxels is reproduced. Using equation (1), a conversion into the $B_1$ field effectively present in the respective voxel can take place.

Figure 7:
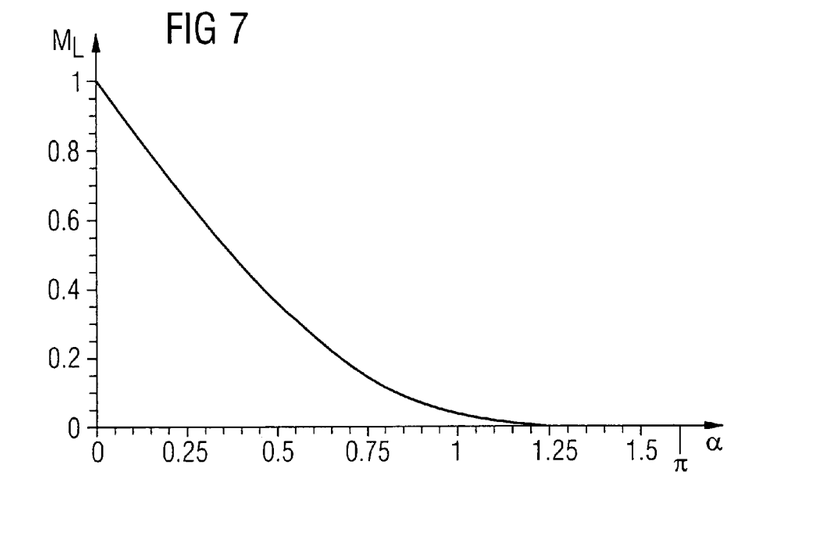
FIG. 7 is a graph illustrating the dependency of the longitudinal magnetization $M_L$ as a function of the attained flip angle α.

As was mentioned above, the magnetic resonance signal registered in the two gradient echo measurements contains in each case also information about the amplitudes of the transverse magnetization $M_T$. The measured amplitude does not enter directly into the evaluation. However, it does play a significant role in the intensity of the measurable signal. FIG. 7 shows as an example the dependency of longitudinal magnetization $M_L$ remaining after an excitation on the attained flip angle α. It is shown that for small angles α the transverse magnetization $M_T$ and thus the signal amplitude is only very small.

However, the amplitude information can be used insofar as to clarify whether the phase information obtained from the respective voxel is acceptable. Insofar as a very fine spatial resolution is not necessary, preferably also combination of the phase position over a plurality of adjacent voxels into a common phase position can take place. In other words, for example, prior to forming the difference, initially an average value, median or the like of all determined phase positions within a voxel group is formed, it being possible to use the measured amplitudes as weighting factors. In this manner, phase information which is measured with a relatively high amplitude is evaluated with greater weighting than phase information from voxels in which the measured amplitude is only small. Any local measurement errors which might occur can be evened out in this manner.

The mathematical and physical derivations enumerated above on which the measurement technique is based apply for the case in which the radio-frequency magnetic field $B_1$ is much greater than the inhomogeneities $\Delta B_0$ of the basic magnetic field $B_0$. Typically, $B_1$ field strengths can be attained with which an excitation flip angle α=π is attained through a rectangular pulse having a length of 0.5 ms. This corresponds to a field strength of $B_1$=20 μT. This is in contrast to basic field inhomogeneities of approx. $\Delta B_0$=1 ppm·$B_0$. In many cases as a result, the assumption that $B_1$ is very much greater than $\Delta B_0$ can be considered to hold approximately. The case of nuclear spin tomographs having high field strengths of, say, 3 Tesla is problematic. In this case, the basic field inhomogeneities $\Delta B_0$ can reach approx. 3 μT.

The influence of the different precession frequency due to the chemical shift of fat and water magnetization can also be considered analogously insofar as no selective saturation of a magnetization type occurs.

In order to estimate the deviation to be expected due to this effect in the measured flip angle from the flip angle actually attainable at the relevant location through a corresponding $B_1$ field (without the inhomogeneities of the $B_0$ field), simulation computations were made in which the Bloch equations for the behavior of the magnetization for radio-frequency excitation in the case $B_1 \approx \Delta B_0$ were solved numerically. Here, a radio-frequency excitation pulse having a total duration of t=260 μs was assumed. In the computation, a time-step: discrimination of 1 μs was used.

Figure 8:
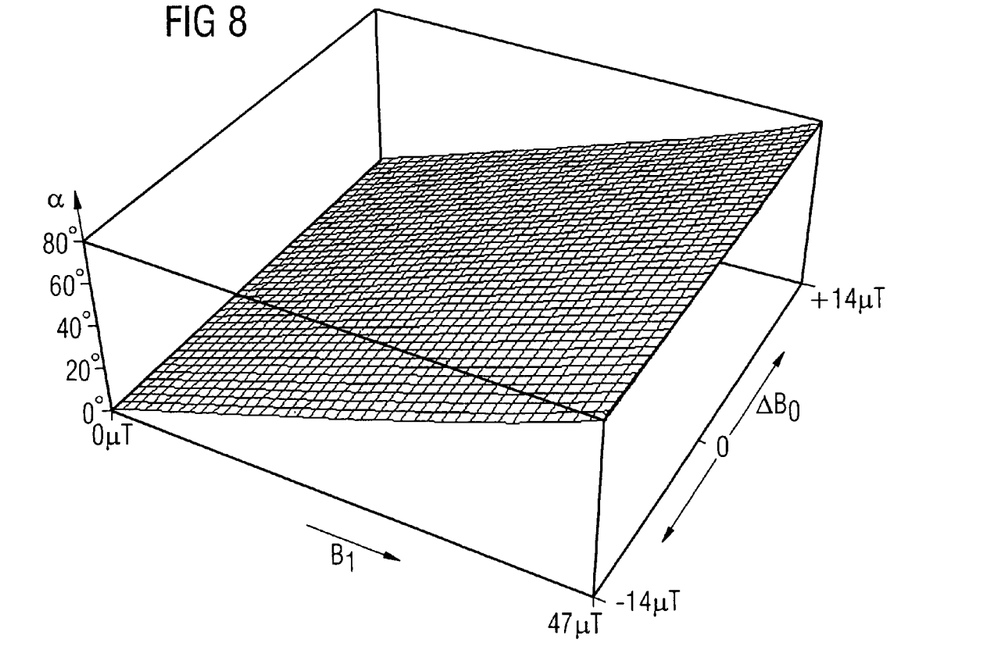
FIG. 8 is a three-dimensional representation of the attained flip angle α as a function of the radiated $B_1$ field and as a function of the magnitude of the deviation $\Delta B_0$ from the basic magnetic field $B_0$.

FIG. 8 shows a result of this simulation. The attained flip angle α is shown as a function of the radiated $B_1$ field and as a function of the deviations $\Delta B_0$ from the basic magnetic field $B_0$. Here, the deviations $\Delta B_0$ range between −14 μT and +14 μT. The radiated radio-frequency field varies from 0 μT to 47 μT. This graph shows that as a relatively good approximation the flip angle α attained at a specific location is determined primarily by the radiated radio-frequency field $B_1$ and the deviation due to inhomogeneities of the basic magnetic field $B_0$ is only very small.

Figure 9:
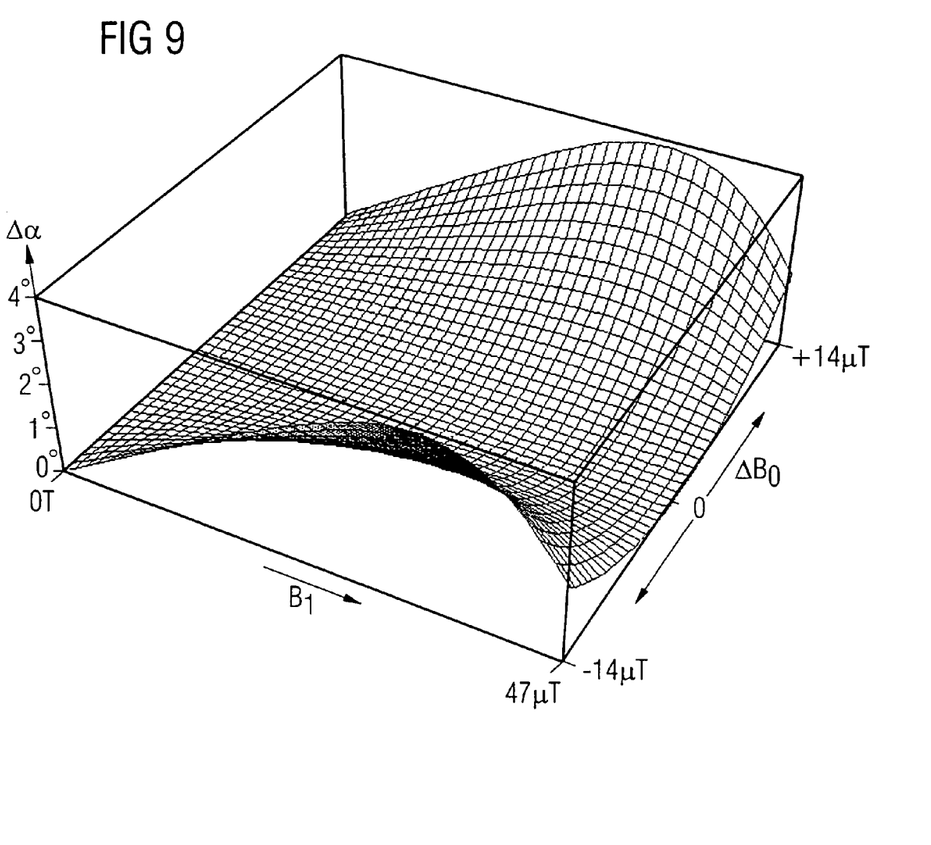
FIG. 9 is a three-dimensional representation of the deviation of the actually attained flip angle $\alpha_{ist}$ from a theoretically attainable flip angle $\alpha_{soll}$ as a function of the radiated $B_1$ field and as a function of the magnitude of the deviation $\Delta B_0$ from the basic magnetic field $B_0$.

To be visible, these deviations require a representation as shown in FIG. 9, in which the difference Δα between the attained flip angle $α_{ist}$ and the theoretically attainable flip angle $α_{soll}$ (which would be attained in a homogeneous basic magnetic field $B_0$) is plotted directly as a function of the radiated radio-frequency field $B_1$ and the deviations $\Delta B_0$ from the basic magnetic field $B_0$. Here, the deviations Δα of the flip angle lie between 0 and 4°, the maximum value of 4° being attained only above $\Delta B_0$=10 μT. Within the range to be expected of the basic field deviation of 3 μT for very large basic magnetic fields of 3T, the deviations of the measured flip angle $α_{ist}$ from the flip angle $α_{soll}$ which is theoretically attainable with the given $B_1$ field still move in an acceptable range.

Insofar as the deviations of the basic magnetic field $B_0$ are known as a function of the location, these values can be correspondingly corrected subsequently during an evaluation of the measurement results using the method according to the invention. For this, only the values underlying FIG. 9 have to be noted in a look-up table. Then, for each pair of values consisting of the excitation flip angle α measured at a certain location and the deviation $\Delta B_0$ from the basic magnetic field $B_0$ known from the $B_0$ adjustment technique, a corrected value for the excitation flip angle α can be read out. A wide variety of techniques for measuring basic magnetic field $B_0$ in a spatially resolved manner are known to one skilled in the art.

In this manner, it is possible to use the method according to the invention even in case of greater basic magnetic field inhomogeneities with relatively good success.

FIGS. 10 to 13 show in each case $B_1$ field distributions measured with the conventional RF field technique described in the introduction in direct comparison to measurements according to the method according to the invention.

Here, the experiments were carried out on a 5 liter bottle phantom which is filled with a load solution of $H_2O$, 1.25 g/l $NiSO_4$ and 2.5 g/l NaCl. A field strength of 3T was set in order to be able to intentionally observe strong $B_1$ inhomogeneities.

In the RF field recordings, the nominal flip angle is 720°, i.e., no signal is generated for α=n·180. The nominal rotational angle α in the measurements using the method according to the invention is equal to 40°. The further parameters for this test experiment are as follows:

Repetition time: $T_R$=50 ms

Echo time: $T_E$=8 ms

Field of view: 350×350×350 mm³

Matrix size: 32×32×32

Bandwidth: 260 Hz/pixel

Recording duration: $T_A$=1 min:47 s

A further considerable reduction in the measurement time (=recording duration) can be obtained using techniques known to those skilled in the art (e.g., multi-gradient echo techniques and/or elliptical sampling of k space).

Figure 10:
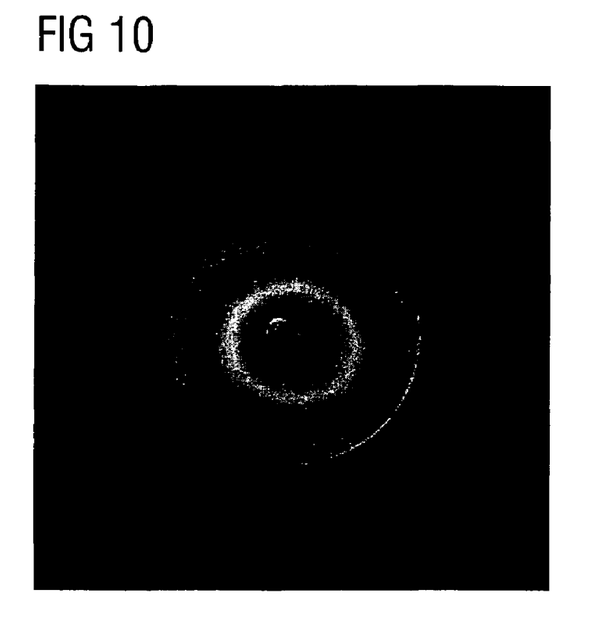
FIG. 10 shows a conventionally measured RF field recording for determining the distribution of the $B_1$ field in a layer through a bottle phantom in the transverse direction.
Figure 11:
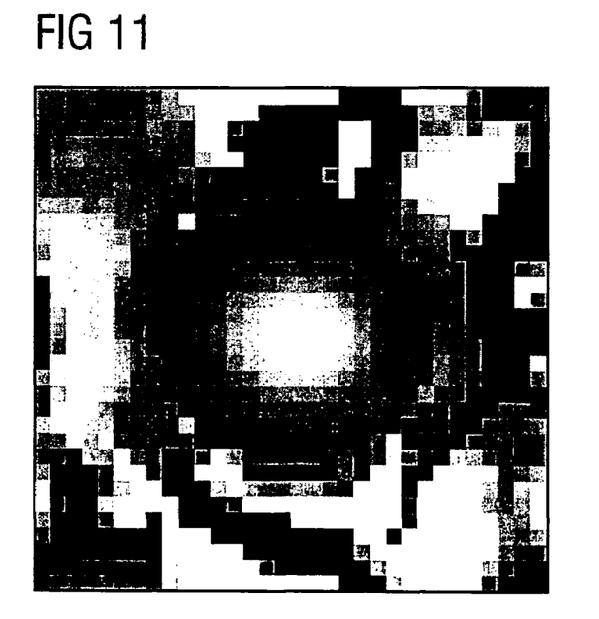
FIG. 11 is a comparison image recording with the method according to the invention through the same slice of the bottle phantom as in FIG. 10.
Figure 12:
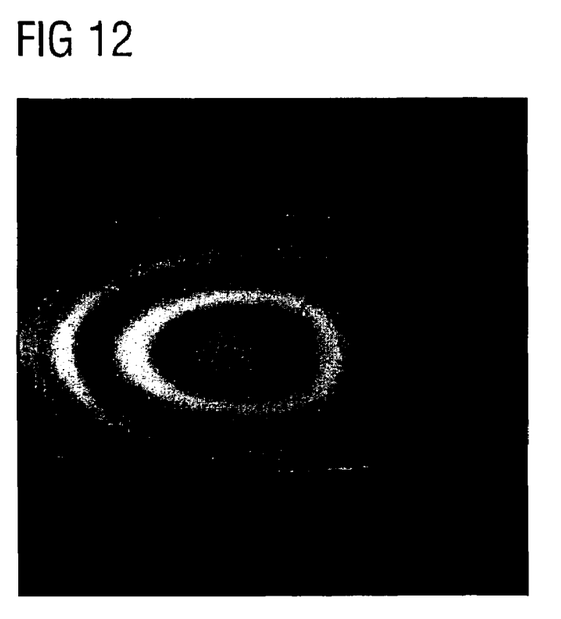
FIG. 12 shows a conventionally measured RF field recording for determining the distribution of the $B_1$ field in a layer through the bottle phantom according to FIG. 10 but in the sagital direction.
Figure 13:
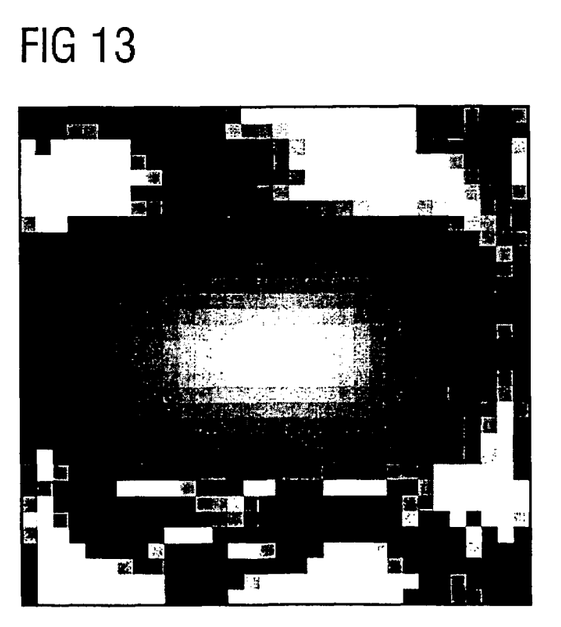
FIG. 13 is a comparison image recording with the method according to the invention through the same layer of the same bottle phantom as in FIG. 12.

FIG. 10 shows first an RF field image of a transverse section through the bottle phantom. FIG. 11 shows the corresponding comparison image which was recorded using the method according to the invention. FIG. 12 shows an RF field image of a sagital section through the bottle phantom and FIG. 13 shows the corresponding comparison image recorded using the method according to the invention. In the evaluations of the images, it should be taken into account that the RF field images are capable only of indicating the deviation from the $B_1$ nominal value in terms of the magnitude, whereas with the method according to the invention absolute deviation values can be measured.

Figure 14:
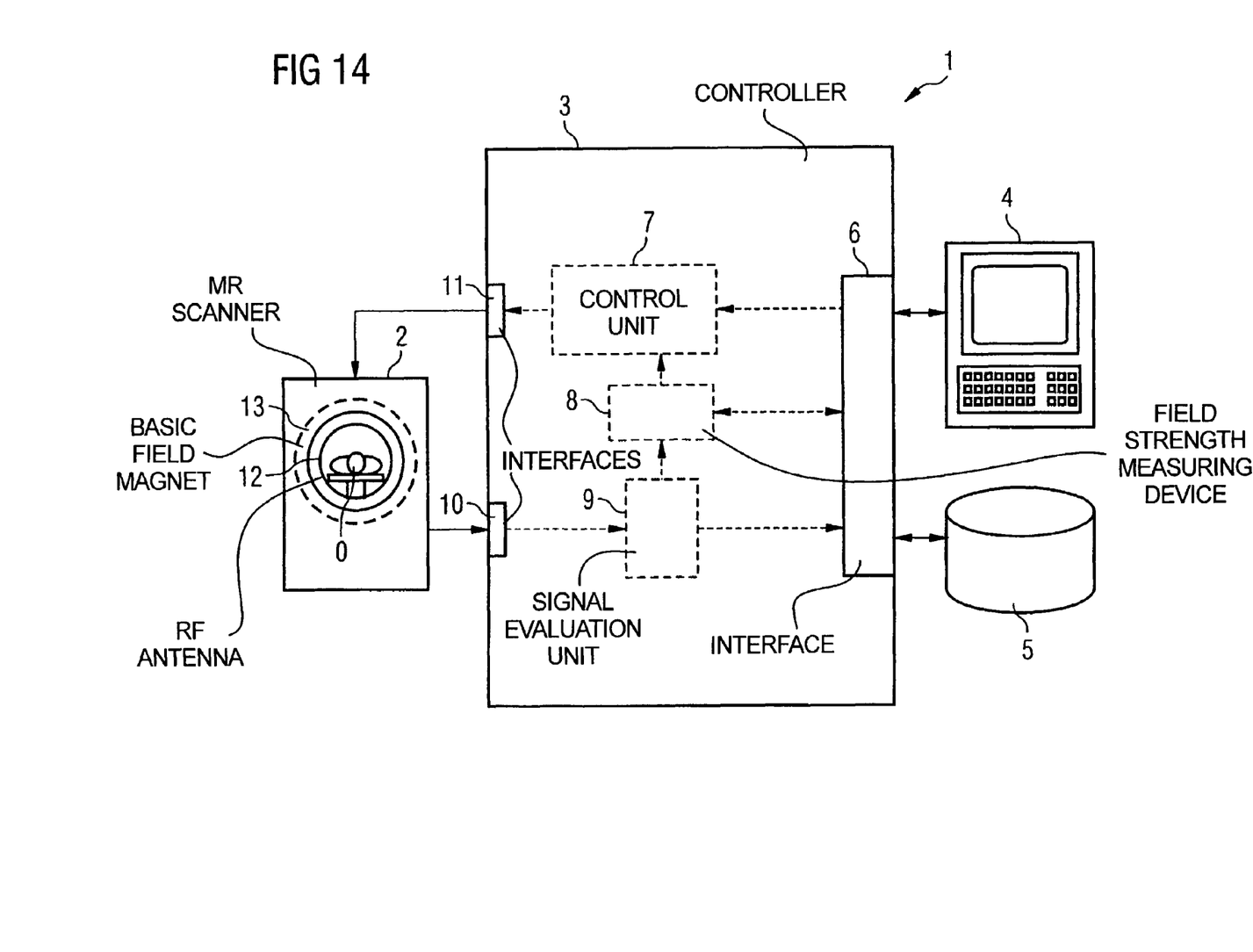
FIG. 14 is a basic block diagram of a magnetic resonance measuring device according to the invention.

The RF field images exhibit a deviation from the $B_1$ nominal value of about 30% in the center and of about 25% at the lateral edge of the bottle. The phase images recorded with the method described herein provide in good agreement with this an excitation rotation angle of 51° in the center, corresponding to a deviation of +28%, 33° at the right and left edges, corresponding to a deviation of −18%, and 31° at the upper and lower edge, corresponding to a deviation of 23%. These images clearly show the good applicability of the method according to the invention for spatially resolved measurement of the $B_1$ field. FIG. 14 shows a simple basic block diagram for an exemplary embodiment of a magnetic resonance measuring device 1 with which the method according to the invention can be executed.

The heart of this magnetic resonance measuring device 1 is a scanner 2 in which an examination subject O is positioned on a table in a ring-shaped basic field magnet 13. Within the basic field magnet 13, there is an antenna 12 for emitting the magnetic resonance radio-frequency pulses.

This is an industry-standard scanner 2 which does not have to fulfill any special additional requirements for the method according to the invention. The scanner 2 is controlled by a controller 3 which is shown separately here. A terminal 4 and a mass memory 5 are connected to the controller 3. The terminal 4 serves as a user interface via which an operator operates the controller 3 and thus the scanner 2. The mass memory 5 serves to store images recorded with the magnetic resonance measuring device. The terminal 4 and memory 5 are connected via an interface 6 to the controller. The controller 3 is connected in turn via interfaces 11, 10 to the scanner 2. The controller 3 as well as the terminal 4 and the memory 5 can also be integrated components of the scanner 2.

It should be clear that the entire magnetic resonance measuring device 1 has in addition all of the further usual components or rather features such as interfaces for connecting to a communications network such as an image information system (Picture Archiving and Communication System, PACS). However, these components are omitted from FIG. 14 for clarity.

Via the terminal 4 and the interface 6, the operator can communicate with a control unit 7 which controls the scanner 2 via the interface 11 and arranges for an emission of the desired radio-frequency pulses or radio-frequency pulse sequences by the antenna 12 and switches the gradients in a suitable manner in order to carry out the desired measurements.

Via the interface 10, the measurement data coming from the scanner 2 are acquired and assembled in a signal evaluation unit 9 into images which then are displayed, for example, via the interface 6 on the terminal 4 and/or saved in the memory 5.

The magnetic resonance measuring device 1 according to the invention has here as a part of the controller 3 a field strength measuring device 8. This field strength measuring device 8 ensures upon suitable command by the terminal 4 and/or fully automatically within an investigation program procedure that from the control unit 7 the necessary radio-frequency pulses for measuring the $B_1$ field using the method according to the invention are emitted via the antenna 12 and the gradients are switched suitably. The magnetic resonance signals measured in this process are passed from the signal evaluation unit 9 to the field strength device 8 which according to the above-described method evaluates the data and reproduces a three-dimensional image for the distribution of the field strength $B_1$ within the measurement volume, e.g., here within a part of the test subject O. These data can then be passed to the control unit 7 so that the determined values can be taken into account in further measurements. Likewise, these data can also be output on the terminal 4 or stored in the memory 5.

As a general rule, the field strength measuring device 8, the signal evaluation unit 9 and the control unit 7 are implemented in the form of software modules on a processor of the controller 3. A purely software-based implementation has the benefit that even existing magnetic resonance devices can be retrofitted through a suitable software upgrade in order to be able to carry out an in vivo measurement of the $B_1$ field strength distribution using the method according to the invention. Here, it is also possible for the field strength measuring device 8, shown in FIG. 14 as a block or rather a corresponding "field strength measurement module", to be formed by of multiple components or sub-routines. These subroutines can also already be used by other components of the controller 3, i.e., in some cases existing subroutines of other program units are exploited in order to keep the cost of implementing the field strength measurement module as low as possible.

By means of the method according to the invention, a very fast method is made available in order to measure the transmit profiles of radio-frequency coils and also to investigate the radio-frequency penetration behavior in vivo. The method functions reliably when using excitation rotation angles in the range of approx. 20° to 70°, even for relatively high basic magnetic fields. The method thus can be used both for the manufacturing process and for the quality control of transmit coils.

Moreover, it is well suited to the optimization of the patient-dependent adjustment of the $B_1$ field in a defined spatial region within an test subject. Preferably, at the start of a measurement, a non-resolving general transmitter adjustment (i.e., a $B_1$ basic adjustment based on conventional techniques) is performed in order to be able to set the desired average excitation rotation angle a priori.

Then, before starting the measurement, additionally a three-dimensional $B_1$ recording can be made with the method according to the invention with the flip angle employed being optimized within a determined volume of interest.

It is also basically possible with this sort of measured three-dimensional $B_1$ field to tune the coil array of the transmitting antenna insofar as such a function is provided by the coil array itself (radio-frequency shimming).

Since it is to be assumed that the distribution of the $B_1$ field and the distribution of the heat energy applied in the body (specific absorption ratio, SAR) have at least a certain relationship, the spatially-resolved $B_1$ distributions measured using the method can also be used to make back conclusions about the heat distribution in the body of the test subject in order to carry out an optimization of the measurement also in this direction.

Finally, it should be noted again that the method described in detail above, as well as the magnetic resonance measuring device, are only exemplary embodiments which can be modified by those skilled in the art in highly diverse manners without departing from the scope of the invention. In particular, instead of the specifically described rectangular excitation pulse, excitation pulses or sequences of excitation pulses with other shapes can be used. An example would be the usage of a first pulse having a certain phase position and a second pulse separate from this with a phase position which is shifted with respect to the first pulse as well as a subsequent third pulse which has the same phase position as the first pulse in order to produce a relationship between the excitation flip angle and the phase position of the transverse magnetization. Accordingly, the evaluation of the measured magnetic resonance signals must then be adapted accordingly.

Although other modifications and changes may be suggested by those skilled in the art, it is the intention of the inventors to embody within the patent warranted hereon all changes and modifications as reasonably and properly come within the scope of their contribution to the art.

I claim:

1. A method for determining a field strength of radio-frequency energy emitted during a magnetic resonance measurement, comprising the steps of:
   from an antenna of a magnetic resonance examination apparatus, emitting at least one radio-frequency pulse from said antenna to generate an antenna-emitted radio-frequency field having a field strength, and thereby causing an examination subject in said radio-frequency field to emit a magnetic resonance signal;
   receiving said magnetic resonance signal;
   determining a phase of said received magnetic resonance signal; and,
   from said determined phase, determining said field strength, of said antenna-emitted radio-frequency field.

2. A method as claimed in claim 1 comprising
   said magnetic resonance signal in said subject in a spatially resolved manner within a measurement volume;
   determining, as said determined phase, a spatially-dependent phase of the received magnetic resonance signal; and
   determining said field strength as a function of a location within said measurement volume.

3. A method as claimed in claim 1 comprising
   receiving said magnetic resonance signal in said subject in a spatially resolved manner within a measurement volume;
   determining, as said determined phase, a spatially-dependent phase of the received magnetic resonance signal; and
   determining said field strength as a function of a location within said measurement volume.

4. A method as claimed in claim 1 wherein
   said at least one radio-frequency pulse produces a flip angle of nuclear spins in said subject, and comprising determining said flip angle from said determined phase and determining said field strength dependent on said flip angle.

5. A method as claimed in claim 1 comprising receiving said magnetic resonance signal in a gradient echo technique.

6. A method as claimed in claim 1 comprising phase-modulating said at least one radio-frequency pulse.

7. A method as claimed in claim 6 comprising employing a phase-modulated rectangular pulse as said at least one radio-frequency pulse.

8. A method as claimed in claim 1 comprising
   receiving said a magnetic resonance signal, as said received magnetic resonance signal in a plurality of respectively separate measurements and, for each measurement, determining the phase of the received magnetic resonance signal, and
   determining a phase difference between the respective phases from two of said plurality of measurements and determining said field strength dependent on said determined phase difference.

9. A method as claimed in claim 8 comprising employing measurements, as said separate measurements, that are identical except for the at least one radio-frequency pulse.

10. A method as claimed in claim 9 comprising emitting said at least one radio-frequency pulse in one of said measurements that starts with a phase, and shifting said phase after a time by a value in a shifted direction, and emitting said at least one radio-frequency pulse in another of said measurements that starts with said phase, and shifting said phase after said time by said value in a direction opposite to said shifted direction.

11. A method as claimed in claim 1 wherein the step of emitting at least one radio-frequency pulse comprises emitting at least one short, intensive radio-frequency pulse.

12. A method as claimed in claim 1 wherein said magnetic resonance examination apparatus has a basic magnetic field associated therewith, said basic magnetic field exhibiting spatially-dependent field inhomogeneities, and wherein the step of determining said field strength comprises determining a spatially-dependent field strength taking said spatially-dependent field inhomogeneities into account.

13. A method as claimed in claim 1 wherein the step of determining said field strength comprises
   determining a spatially-dependent field strength for a group of adjacent voxels by identifying the phase of respective received magnetic resonance signals for individual voxels in said group and combining the respective phases into a common phase, and
   determining the strength for said voxel group from said common phase.

14. A method as claimed in claim 13 wherein each of the received magnetic resonance signals for the individual voxels has an amplitude, and comprising weighting the determined phase dependent on the amplitude of the associated received magnetic resonance signal.

15. A method as claimed in claim 1 wherein the step of determining said field strength comprises
   determining a spatially-dependent field strength for a group of adjacent voxels by identifying the phase difference of respective received magnetic resonance signals for individual voxels in said group and combining the respective phase differences into a common phase difference, and
   determining the field strength for said voxel group from said common phase difference.

16. A method as claimed in claim 15 wherein each of the received magnetic resonance signals for the individual voxels has an amplitude, and comprising weighting the phase difference dependent on the amplitude of the associated received magnetic resonance signal.

17. A method as claimed in claim 1 comprising employing said field strength determined from said phase to optimize said field strength in a predetermined volume region of the subject.

18. A magnetic resonance examination apparatus comprising:
   a magnetic resonance scanner configured to receive a subject therein, said magnetic resonance scanner having a radio-frequency antenna;
   a control computer that operates said magnetic resonance scanner, including operating said radio-frequency antenna; and
   said control computer operating said magnetic resonance scanner and said radio-frequency antenna to emit at least one radio-frequency pulse from said radio-frequency antenna in order to generate an antenna-emitted radio-frequency field having a field strength, and thereby exciting a magnetic resonance signal from said subject, and in order to acquire said excited magnetic resonance signal, said control computer determining a phase of said acquired magnetic resonance signal, and determining said field strength of said antenna-emitted radio-frequency field from said determined phase.

19. A computer readable medium encoded with a computer program loadable into a control computer of a magnetic resonance examination apparatus having a radio-frequency antenna operated by said control computer, said computer program running in said control computer and causing said control computer to:

operate said antenna to emit at least one radio-frequency pulse from said radio-frequency antenna in order to generate an antenna-emitted radio-frequency field having a field strength, and thereby exciting a magnetic resonance signal in a subject in said field;

acquire said magnetic resonance signal; and determine a phase of said acquired magnetic resonance signal and determine said field strength of said antenna-emitted radio-frequency field from said determined phase.

* * * * *